United States Patent [19]
Rao et al.

[11] 4,028,628
[45] June 7, 1977

[54] TRANSCEIVERS FOR SINGLE CHANNEL CARRIER TELEPHONE SYSTEMS

[75] Inventors: Tadikonda Narashimha Rao, Morristown, N.J.; Rouben Toumani, Teheran, Iran

[73] Assignee: Bell Telephone Laboratories, Incorporated, Murray Hill, N.J.

[22] Filed: Dec. 5, 1975

[21] Appl. No.: 638,152

[52] U.S. Cl. ............................. 325/400; 325/405; 333/14; 358/174
[51] Int. Cl.² ........................................ H04B 1/16
[58] Field of Search ............... 178/7.3 R, 7.3 DC; 179/16 F; 333/81 R, 14 R; 325/400

[56] References Cited
UNITED STATES PATENTS

| | | | |
|---|---|---|---|
| 2,328,951 | 9/1943 | Bryant | 333/14 |
| 2,387,652 | 10/1945 | Dickieson | 333/14 |
| 2,558,002 | 6/1951 | Ross | 333/14 |
| 3,569,620 | 3/1971 | Baun | 178/7.3 DC |
| 3,823,379 | 7/1974 | George | 178/7.3 DC |
| 3,838,210 | 9/1974 | Peil | 178/7.3 DC |

Primary Examiner—Harold I. Pitts
Attorney, Agent, or Firm—Robert O. Nimtz

[57] ABSTRACT

A single channel carrier system is disclosed in which carrier techniques are used to add a second private talking path on a normal telephone subscriber loop. A central office unit modulates the second subscriber's signal to an inaudible range while the remote subscriber's unit demodulates this signal to recover the voice signal. The same process is used in the opposite direction utilizing a different carrier frequency.

Each unit includes a carrier receiver having automatic gain control circuits and a variable attenuation circuit. The automatic gain control circuit includes a direct current clamp to minimize excursions of the AGC signal in the absence of a received carrier. The variable attenuation circuit uses a diode bridge shunting the signal path and controlled by the AGC signal. A linear carrier oscillator is implemented by providing a constant current source of oscillation energy.

8 Claims, 7 Drawing Figures

SINGLE CHANNEL CARRIER SYSTEM

CENTRAL OFFICE UNIT

SUBSCRIBER UNIT

TRANSMITTER

RINGING CONTROL

SIGNAL CONTROL

TRANSCEIVERS FOR SINGLE CHANNEL CARRIER TELEPHONE SYSTEMS

BACKGROUND OF THE INVENTION

1. Field of the Invention

This invention relates to carrier transmission systems and, more particularly, to automatic signal level control circuits for such systems.

2. Description of the Prior Art

Telephone carrier systems such as those described in L. Q. Kraisen et al U.S. Pat. No. 3,510,584, granted May 5, 1970, P. J. May et al U.S. Pat. No. 3,601,538, granted Aug. 24, 1971, and J. Garcia et al U.S. Pat. No. 3,700,817, granted Oct. 24, 1972, include carrier modulation and demodulation circuits for modulating and recovering voice signals in single channel carrier systems. Due to the wide variation in signal levels in such systems, it is necessary to provide automatic gain control circuits to control the level of received signals. It is customary in such automatic gain control circuits to recover the direct current component of the received signal and use that direct current component to control the level of the signal received.

If the audio frequency components of the detected signal are not completely removed from the AGC signal, second harmonic distortion occurs, limiting the quality of the received signal. This second harmonic distortion can be minimized by providing a very large filtering capacitor in the AGC circuit. Unfortunately, however, such a large capacitor lengthens the response time of the AGC circuit and makes it difficult for the receiver to track transient supervisory signals such as dial pulsing, ringing, and off-hook signals.

SUMMARY OF THE INVENTION

In accordance with the illustrative embodiment of the present invention, the automatic gain control circuits in a signal receiver include a direct current clamp circuit which clamps the input to the AGC circuit close to its average or quiescent value in the absence of the received carrier signal. This clamp minimizes the voltage level change the AGC circuit must make when a supervisory signal is received on an idle circuit. The supervisory signals can therefore be detected more quickly and more accurately.

In accordance with one feature of the present invention, the output of the automatic gain control circuit is applied to a variable attenuation circuit, a vario-losser, which takes the form of a diode bridge. One set of vertices of the bridge is connected across the source of the signal to be attenuated, and the other set of vertices receives the control signal. Controlled attenuation is thereby achieved without the use of coupling capacitors which are difficult to integrate.

In accordance with another feature of the present invention, the carrier frequency signals are produced by an oscillator having amplitude stabilization without the need for non-linear devices. The operating current for the oscillator is supplied by a constant current source, thus making the amplitude of oscillation dependent only upon the Q of a tuned circuit. A simple damping device such as a resistor can thus be used to control the Q and hence the amplitude of oscillation without affecting the linearity of the oscillator output signal.

DETAILED DESCRIPTION

Figure 1:
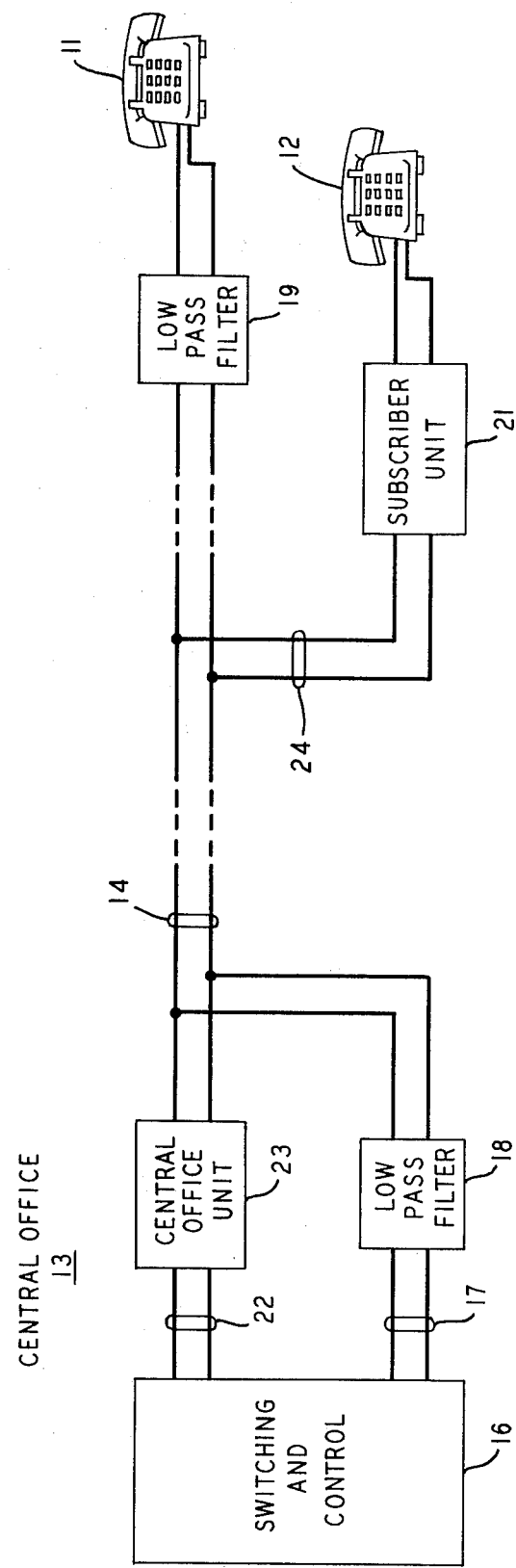
FIG. 1 is a general block diagram of a single channel carrier system incorporating the present invention.

Referring more particularly to FIG. 1, there is shown a basic single channel carrier system which is helpful in understanding the present invention. In FIG. 1 two separate telephones 11 and 12 provide independent private line telephone services either both to the same subscriber or to two separate subscribers. The telephone circuit connecting switching and control circuits 16 through pair 14 to subscriber 11 is the normal physical telephone circuit since the entire link is a direct current connection. The telephone circuit connecting switching and control circuit 16 to subscriber 12, on the other hand, is a derived or carrier circuit since communication on this link is by way of modulated carrier signals. Each of the stations at sets 11 and 12 may include more than one physical telephone set by utilizing standard extension telephone techniques.

A central office unit 23 connects a second line appearance 22 at the central office to the same metallic pair 14 while a subscriber unit 21 connects the derived circuit connected to telephone 12 to metallic pair 14. The derived circuit therefore extends from switching and control circuits 16 through appearance 22, and office unit 23 to pair 14 and thence through a drop wire 24 to subscriber unit 21 and telephone 12. The physical telephone circuit includes low-pass filter 18 at the central office and low-pass filter 19 at the subscriber end of metallic pair 14 to pass voice frequency signals while preventing the modulated carrier waves from reaching appearance 17 or physical subscriber telephone set 11.

Figure 2:
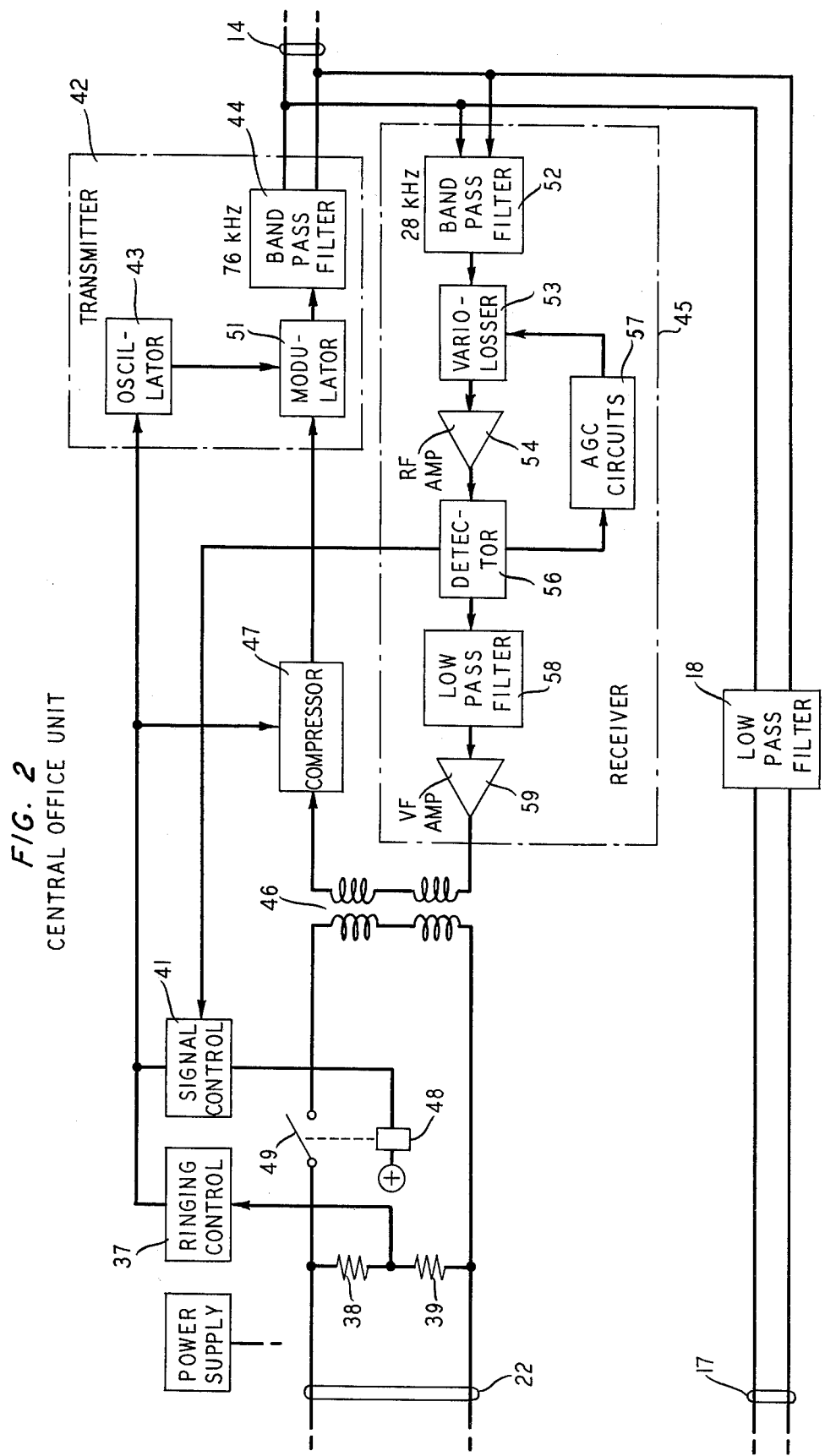
FIG. 2 is a more detailed block diagram of the central office unit of the single channel carrier system of FIG. 1.

In FIG. 2 there is shown a detailed block diagram of the central office unit 23 in FIG. 1. The central office unit, as was described in connection with FIG. 1, connects appearance 22 with the wire pair 14. Ringing signals which are generated within the central office are coupled to a ringing control circuit 37 through the resistive voltage divider comprising resistors 38 and 39. In response to ringing signals, ringing control circuits 37 switch oscillator 43 in transmitter 42 on and off at a rate corresponding to the ringing signal. The resulting signal, which is effectively the central office carrier frequency (e.g., 76 kHz) pulse modulated at the ringing frequency, is coupled to pair 14 through bandpass filter 44.

When the remote subscriber goes off-hook to answer the telephone or to place a call, the carrier signal at the remote location is started up and transmitted on pair 14 to receiver circuit 45. The signal passes through bandpass filter 52, a vario-losser 53, and a radio frequency amplifier 54 to a detector circuit 56. This signal detected by detector 56 is used to activate signal control circuits 41 thereby operating relay 48 and energizing compressor 47 and oscillator 43 in transmitter 42. The operation of relay 48 closes contacts 49 to complete an electrical path through hybrid network 46 across appearance 22. This loading at appearance 22 signals the central office that the subscriber has gone off-hook, all in accordance with standard telephone operation.

The closure of contacts 49 also completes the electrical path through hybrid network 46 allowing voice frequency signals to pass from appearance 22 to the compressor 47 and thence to the modulator 51 in transmitter 42 and through bandpass filter 44 to wire pair 14.

Compressor 47, together with a matching expandor circuit in the remote subscriber unit (FIG. 3), provides syllabic companding of the voice signals transmitted from the central office to the derived subscriber. This companding characteristic provides greater immunity of the voice signals from cross-talk interference and thereby insures a high quality signal being delivered to the derived subscriber. A syllabic compandor which can be used in the system of FIG. 1 is disclosed in the copending application of R. Toumani Ser. No. 497,136, filed Aug. 14, 1974, matured into U.S. Pat. No. 3,919,654 on Nov. 11, 1975.

The modulator 51 modulates the voice frequency signals onto the carrier signal from oscillator 43 to a band of frequencies passed by filter 44. Double sideband modulation is appropriate for this application, although any form of amplitude modulation can also be used.

Carrier modulated signals received on wire pair 14 from the remote subscriber unit pass through bandpass filter 52 as described above. It will be noted that the carrier frequency for transmission (76 kHz) is different than the carrier frequency for reception (e.g., 28 kHz) to keep the transmitting and receiving channels well separated.

Detector 56 supplies voice frequency signals detected from the carrier wave through low-pass filter 58 and thence through voice frequency amplifier 59 to hybrid network 46. Detector circuit 56 also supplies detector output signals to automatic gain control circuits 57, the output of which is supplied to vario-losser 53. The AGC circuits 57 utilize the amplitude of the detected audio signal to control vario-losser 53 so as to maintain a substantially constant voice frequency level at the receiver output. This operation is important in the system of FIG. 1 due to the wide variations in subscriber loop lengths, bridging losses, and circuit component values.

The detector 56, signal control circuit 41, and relay 48 serve to repeat dial pulses in exactly the same fashion as they are used in detecting the off-hook condition. That is, dial pulses at the remote location interrupt the carrier frequency transmitted from that location. This interrupted carrier is received by receiver 45 and detected by detector 56. These dial pulse signals are passed to control circuit 41 and utilized to operate relay 48 at the dial pulsing rate. Closure of contacts 49 at the dial pulse rate draws current from the central office in the same fashion as the dial contact closures on a physical circuit, thus repeating the subscriber dial pulses for the central office equipment.

Also shown in FIG. 2 is the low-pass filter 18 connecting the physical subscriber appearance 17 with the metallic pair 14. Low-pass filter 18, of course, serves to block both the transmitted and the received modulated carrier signals and thus isolate the physical subscriber's circuit from the derived subscriber's circuit.

Figure 3:
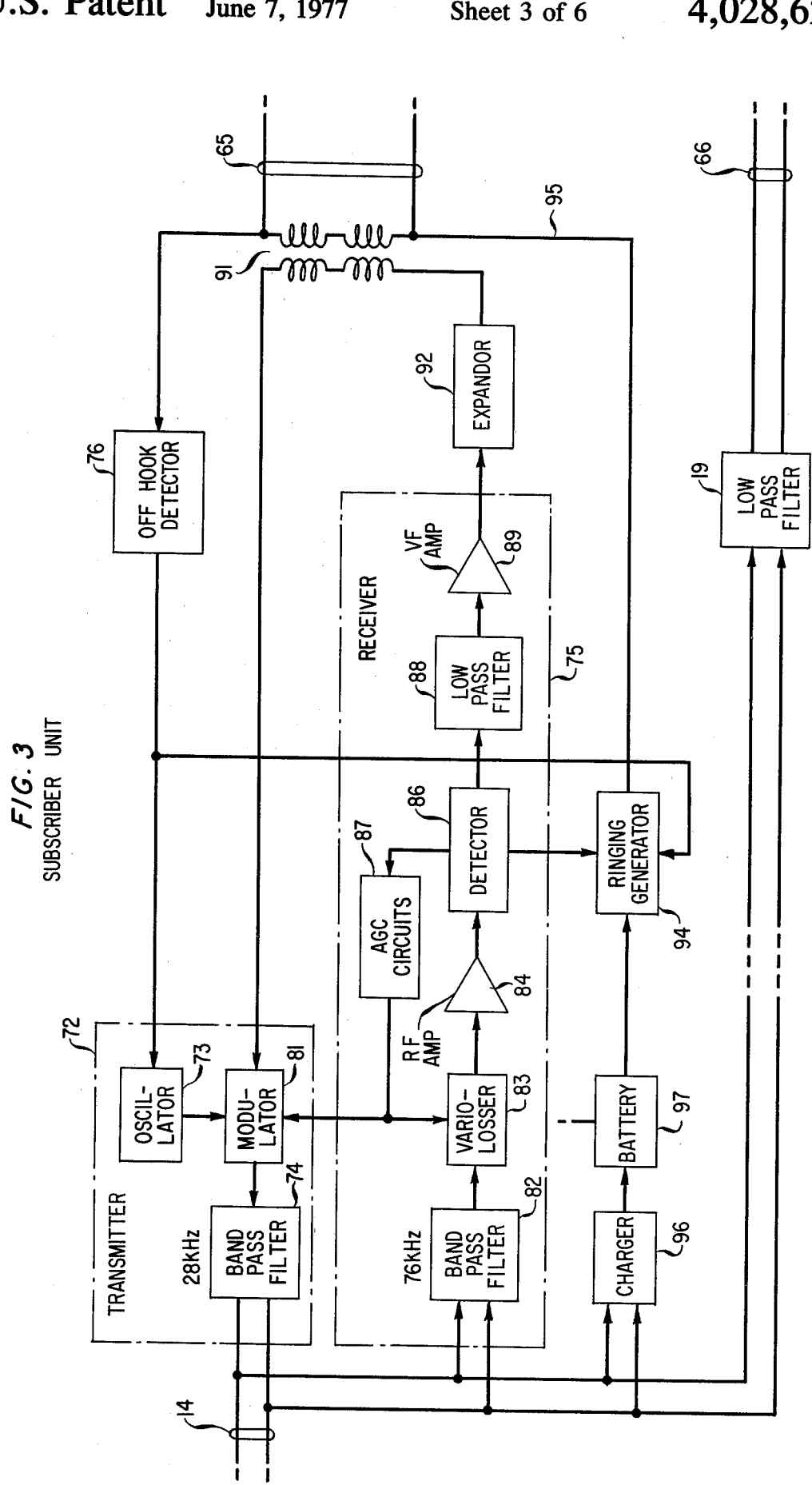
FIG. 3 is a more detailed block diagram of the subscriber unit of the single channel carrier system of FIG. 1.

In FIG. 3 there is shown a detailed circuit diagram of the subscriber unit 21 of FIG. 1 which connects the metallic wires 14 to a local derived subscriber telephone loop 65. Modulated carrier signals from the central office unit arriving on pair 14 pass through bandpass filter 82, vario-losser 83 and radio frequency amplifier 84 to detector circuit 86. If the carrier signal is interrupted at a ringing signal rate, as described in connection with FIG. 2, detector 86 produces a signal interrupted at this same rate which can be delivered to a ringing generator 94. Ringing generator 94, in turn, delivers the ringing signal via line 95 to the subscriber loop 65. A ringing generator suitable for this purpose is shown in the copending applications of present applicants Ser. No. 638,151, D. E. Stone Ser. No. 638,162, and of B. S. Bosik-D. E. Stone Ser. No. 638,163, all filed of even date herewith.

Voice frequency signals from detector 86 also pass through low-pass filter 88 and voice frequency amplifier 89 to an expandor circuit 92 which is the complement of the compressor circuit 47 in FIG. 2. These voice frequency signals are delivered by way of hybrid network 91 to the subscriber loop 65.

Signals from detector 86 are also delivered to AGC circuits 87 to control vario-losser 83 and thus maintain the average received signal level constant. The output of AGC circuit 87 is also delivered to modulator 81. Modulator 81 includes a variable attenuation circuit like vario-losser 83 which, under the control of AGC signals, varies the amplitude of the transmitted carrier wave to track the amplitude of the received signal. In this way, the subscriber unit automatically compensates for various loop lengths by adjusting the amplitude of the transmitted signal by this amplitude of the received signal. This technique is called cross-control and is common in carrier systems of this type.

The ringing generator 94 is energized by a battery 97 connected to a charger circuit 96, itself connected to the metallic pair 14. Charger circuit 96 is energized by the central office battery and is used to charge local battery 97 during periods in which line 14 is not in use. Battery 97 provides the energy for operating all of the subscriber unit electronics during conversations by the derived subscriber. A battery charger suitable for this application is described in the copending application of B. S. Bosik Ser. No. 638,164, filed of even date herewith.

When the derived subscriber connected to loop 65 goes off-hook, the current drawn through his set is detected by off-hook detector 76 and used to trip the ringing generator 94 so as to terminate ringing signals. The off-hook signal also turns oscillator 73 on. Oscillator 73 supplies a carrier signal to modulator 81, the output of which passes through bandpass filter 74 to metallic pair 14 as described in connection with FIG. 2. This carrier signal is detected and the off-hook signal is repeated to the central office by the closure of contacts 49 (FIG. 2).

This same circuit arrangement is used to repeat the dial pulses originated at the derived subscriber's telephone set. Off-hook detector 76 also detects the closures caused by dial pulsing contacts and keys oscillator 73 on and off at the dial pulse rate. These carrier bursts are also transmitted to the central office unit and detected to operate contacts 49.

The low-pass filter 19 is shown in FIG. 3 connecting metallic pair 14 to local loop 66 which, in turn, is connected to the physical subscriber's telephone set as discussed in connection with FIG. 1.

Figure 4:
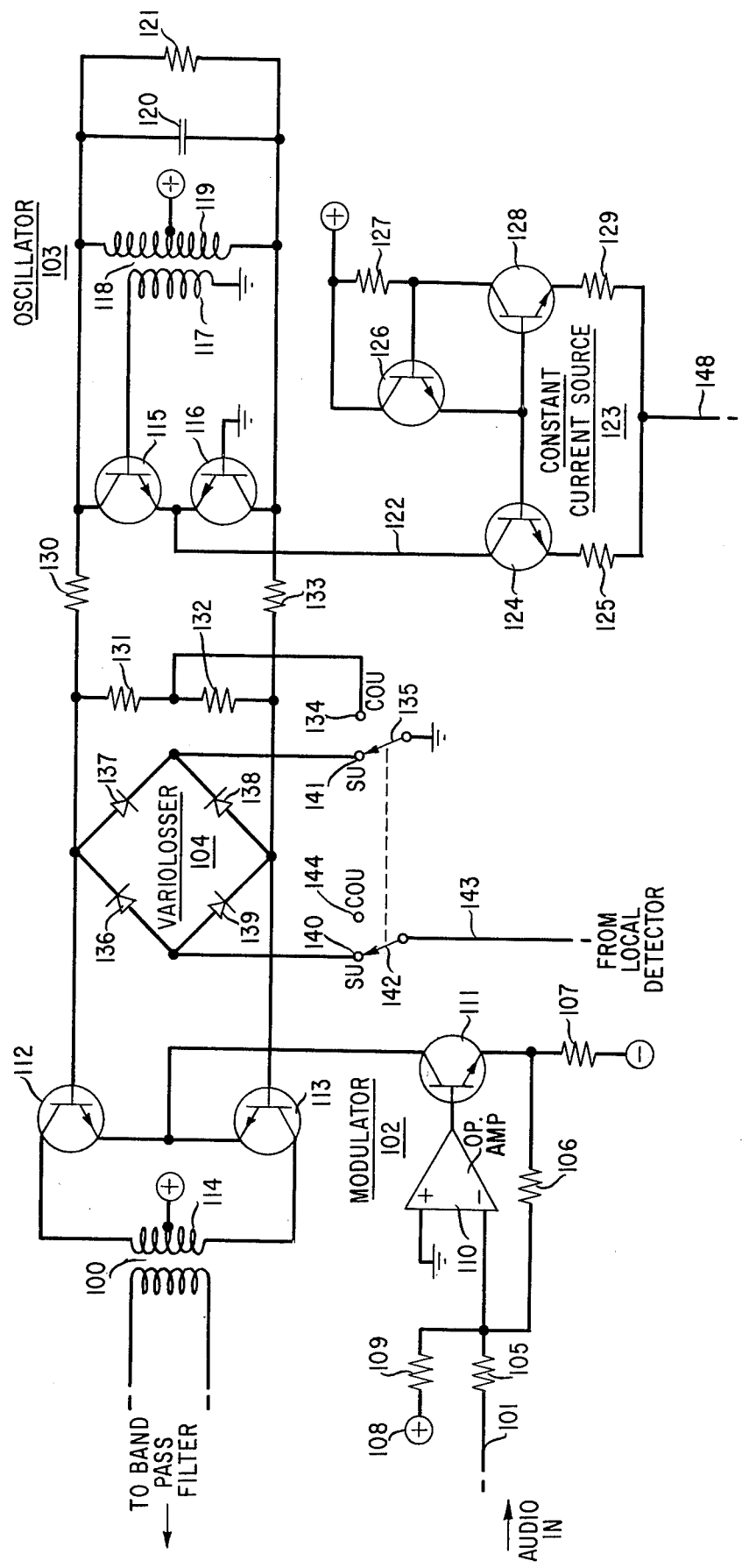
FIG. 4 is a detailed circuit diagram of the transmitter portion of the central office and subscriber units of FIG. 2 and 3.

In FIG. 4 there is shown a detailed circuit diagram of a transmitter which can be used for both the transmitter 42 in the central office unit of FIG. 2 and also of the transmitter 72 of the subscriber unit of FIG. 3. The transmitter circuit of FIG. 4 delivers signals to transformer 100 and thence to a bandpass filter such as filters 44 and 74 in FIGS. 2 and 3, respectively. A voice frequency signal appearing on lead 101 is used to modulate a carrier signal in modulator circuits 102 to form a double sideband amplitude modulated signal. The carrier signal is derived from an oscillator 103 which delivers the carrier signal through vario-losser circuit 104 to the balanced modulator 102.

In particular, the audio signal on lead 101 is applied to a voltage divider circuit comprising resistors 105, 106, and 107. A direct current signal from voltage source 108 is added to the audio signal through resistor 109. The ratio of the audio and direct current signals is the modulation index of the transmitted signal and is controlled by the values of resistors 105, 106, 107, and 109. An operational amplifier 110 provides high loop gain around transistor 111 so that the current drawn through the collector of transistor 111 is essentially free of harmonics of the modulating audio input signal at lead 101. The modulator also includes a differential pair of transistors 112 and 113 deriving their emitter current supply from transistor 111. The collectors of transistors 112 and 113 are connected to opposite ends of a center tapped winding 114 on transformer 100. The center tap is connected to a bias supply for the collector electrodes of transistors 112 and 113.

The oscillator 103 uses a differential pair of transistors 115 and 116. The base of transistor 116 is connected to ground while the base of transistor 115 is connected to a feedback winding 117 of transformer 118. The other winding 119 of transformer 118, together with a capacitor 120, forms a tuned tank circuit for determining the frequency of oscillation of oscillator 103. A resistor 121 is connected across this tank circuit to dampen oscillations, set the Q of the tuned circuit and thereby determine the amplitude of oscillation of oscillator 103. The collector electrodes of transistors 115 and 116 are connected to opposite ends of winding 119, the center tap of which is connected to a supply voltage.

The emitter electrodes of transistors 115 and 116 are connected to a common lead 112 leading to a constant current source 123. Source 123 includes a transistor 124 which supplies a constant current through resistor 125 to the emitter electrodes of transistors 115 and 116. Transistor 126 detects the voltage drop across resistor 127 and delivers a control current to the bases of transistors 124 and 128 to insure constant current flow through both of these transistors. The constant current through transistor 128 and 129, in turn, insures a fixed voltage drop across resistor 127 and thus insures the constant control to transistor 124 to maintain the current on lead 122 at a preselected value.

The constant current source 123 is supplied through lead 148 which is connected to the negative battery supply only in response to the detection of ringing signals or received carrier signals (at the central office unit, FIG. 2) or in response to off-hook signals (at the subscriber unit, FIG. 3). The oscillator is therefore only energized when necessary to transmit voice or supervisory signals.

Due to the constant current supplied to the emitters of transistors 115 and 116, the amplitude of oscillations in the tank circuit comprising winding 119 and capacitor 120 is determined only by the Q of this tuned circuit. The value of resistor 121 can be selected to adjust the value of Q to any preselected number and thus limit the amplitude of oscillations of oscillator 103 to any preselected value. Moreover, since resistor 121 is a linear device, the amplitude limitation is entirely linear and oscillator 103 provides a stable carrier signal of a preselected frequency and amplitude.

The carrier signal from oscillator 103 is supplied across a voltage divider comprising resistors 130, 131, 132, and 133. By grounding the midpoint of resistors 131 and 132 by means of contact 134 of switch 135, the carrier signal amplitude can be selected so as to fall in a desired range of operation of transistors 112 and 113. In this mode of operation, modulator 102 operates as a switching modulator generating output sideband signals which are the sum and difference frequencies between the carrier signal and the audio signals from lead 101.

A vario-losser circuit 104 comprising diodes 136, 137, 138, and 139 is connected in shunt across the input to modulator 102. Diodes 136 through 139 are connected in a standard bridge arrangement with one set of vertices connected to the balanced input of modulator 102 and the other set of vertices connected to contacts 140 and 141 of switches 142 and 135, respectively. When switches 135 and 142 are in the positions shown, a control signal is delivered by way of lead 143 from the automatic gain control circuit of FIG. 3 to the vario-losser 104. At the same time, the midpoint of resistors 131 and 132 is disconnected from ground potential and thus the voltage divider is removed from the circuit and vario-losser 104 is substituted.

In operation, the control signal on lead 143 varies the operating point of diodes 136 through 139 and thereby provides a variable shunt ac impedance across the input to modulator 102. This variable attenuation circuit 104, moreover, utilizes no capacitive coupling elements and therefore can be readily realized in integrated circuit form. Furthermore, although the diodes of vario-losser 104 must be operated in their non-linear region in order to provide variable attenuation, this non-linear predistortion of the carrier signal is exactly compensated for by operating transistors 112 and 113 in an identical but complementary non-linear region. The resulting output signals at output transformer 100 are therefore linear when vario-losser 104 is in the circuit.

When the transmitter of FIG. 4 is located at the central office unit (COU), switches 135 and 142 are transferred to the right-hand contacts 134 and 144 to disconnect vario-losser 104 from the circuit and to connect resistors 131 and 132 into the circuit. Under these conditions the modulator 102 operates in its switching mode.

At the subscriber unit (SU) of FIG. 3, the transmitter has switches 142 and 135 in the left-hand position shown in FIG. 4 and the cross-control signal on lead 143 is used to control vario-losser 104. This cross-control current is derived from the subscriber unit receiver and controls the alternating current impedance of the diode bridge 104, hence controlling the carrier level at the bases of transistors 112 and 113. This control on the carrier level of the transmitter varies the level of the output signal without affecting the modulation index. The diode bridge 104 also serves to cancel the gain variations of transistors 112 and 113 due to temperature variations and to reduce carrier frequency distortion by predistorting the carrier signal in a complementary manner.

At the central office unit, the output level of the transmitter is to remain constant and hence switches 142 and 135 disconnect the vario-losser 104 and connect resistors 131 and 132 to the modulator input leads. Under this condition, the vario-losser 104 is not conducting and the carrier signal at the bases of carriers 112 and 113 is sufficient to switch the modulating signal current back and forth between transistors 112 and 113.

It will be noted that the entire transmitter circuit of FIG. 4 can be incorporated on a single integrated circuit chip which can be used at both the central office and the subscriber units. The frequency determining and amplitude determining elements can be realized by separate components to permit different carrier frequencies at the two terminals and to permit careful control of amplitude levels.

Figure 5:
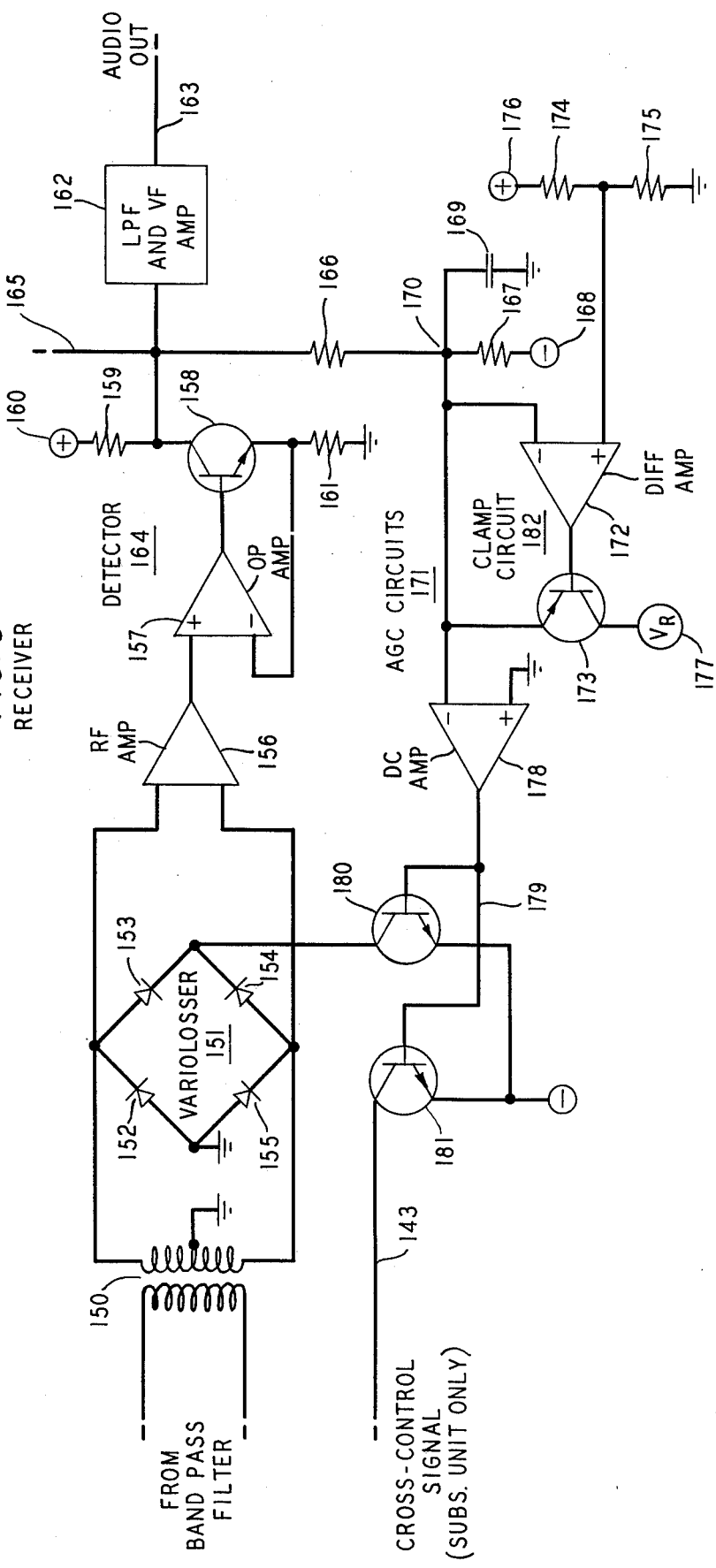
FIG. 5 is a detailed circuit diagram of the receiver portions of the central office and subscriber units shown in FIG. 2 and 3.

In FIG. 5 there is shown a detailed circuit diagram of a receiver circuit which can be used as receiver 45 in FIG. 2 or as receiver 75 in FIG. 3. The receiver of FIG. 5 receives double sideband amplitude modulated signals from a bandpass filter (filter 52, in FIG. 2 or filter 82 in FIG. 3) which are delivered to input transformer 150. These signals are applied across a vario-losser circuit 151 comprising diodes 152, 153, 154, and 155 to a radio frequency amplifier 156. Amplifier 156 is of standard configuration and has not been shown in detail. The output of radio frequency amplifier 156 is delivered to one input of operational amplifier 157.

Transistor 158 acts as a rectifier in the feedback path around operational amplifier 157. The high gain of the operational amplifier 157 absorbs the base emitter voltage drop of transistor 158 so that the collector current of transistor 158 is a precise half wave rectified version of the input signal from amplifier 156. The output of transistor 158 is delivered to low-pass filter and voice frequency amplifier 162. The demodulated audio signal therefore appears at lead 163 and is supplied as shown in FIG. 2 and 3 to the receiving leg of a hybrid network for delivery to the voice frequency circuits.

Operational amplifier 157 and transistor 158 together comprise a detector circuit 164 which provides an output signal which closely tracks the envelope of the received modulated carrier signal. This output is supplied by way of lead 165 to the signal control circuits 41 (FIG. 2) or to the ringing generator 94 (FIG. 3), depending on at which terminal the receiver is located.

The output of detector 164 is also supplied to a voltage divider comprising resistors 166 and 167 connected to negative supply voltage 168. A capacitor 169 is connected between ground and the midpoint 170 of resistors 166 and 167. The voltage at point 170 serves as the input voltage to automatic gain control circuits 171.

Automatic gain control circuit 171 comprises a differential amplifier 172, the output of which is connected to the base electrode of transistor 173. One input to differential amplifier 172 is derived from a voltage divider including resistors 174 and 175 connected across supply source 176. The other input to differential amplifier 172 was taken from midpoint 170. Transistor 173, when operated, connects midpoint 170 to a reference voltage source 177.

Midpoint 170 is connected to the input of a high gain direct current amplifier 178, the output of which appears on lead 179. This output on lead 179 is used to drive transistor 180 to thereby control vario-losser 151 and provide a normal automatic gain control function. The signal on lead 179 also controls transistor 181 which supplies a cross-control signal on lead 143 to the transmitter circuit of FIG. 4.

In operation, the audio envelope at the output of detector 164 is heavily filtered by capacitor 169 to provide a signal at point 170 which can be used to provide an automatic gain control function. In accordance with standard practice, capacitor 169 is made as large as possible to reduce the amount of the residual audio signal delivered to the vario-losser control circuit 151. Any residual audio signal in the vario-losser 151 introduces second harmonic distortion into the voice signal. Using such a large value for capacitor 169, however, slows down the response time of the automatic gain control circuit. This is not desirable in the receiver of FIG. 5 because this receiver must also track rapidly changing supervisory control signals such as dial pulses as well as receive voice signals.

In order to insure good second harmonic rejection, and a reasonable AGC response time, a clamp circuit 182 is employed which serves to clamp the voltage at point 170 to a reference voltage 177 whenever the carrier signal disappears and the output of detector 164 drops to zero. Without such a clamp circuit, the voltage on capacitor 169 would tend to rise to the value of supply voltage 160. Differential amplifier 172, however, compares the voltage level at point 170 with a reference voltage developed by the divider comprising resistors 174 and 175. If the voltage at point 170 exceeds this reference voltage, differential amplifier 170 operates transistor 173 to clamp point 170 to the reference voltage 177.

The value of the reference voltage at 177 is selected to be close to the steady-state operating point of detector 157, i.e., the value produced by an unmodulated carrier signal. Because of this clamp, sudden bursts of carrier signal representing, for example, dial pulses, are appropriately amplitude controlled by the AGC circuits 171 because the voltage on capacitor 169 needs to change only a small amount in order to track the detector output signal. In this way, both rapid tracking of supervisory signals and good second harmonic distortion are provided. Clamping of the AGC input signal close to its steady-state value in the absence of a carrier signal, in fact, permits harmonic distortion to be reduced about 40 dB for fifty percent modulation at 1 kHz without unduly long setting times.

In order to minimize the drain on the battery at the subscriber unit, the audio portion of the receiver of FIG. 5 is energized only after the subscriber goes off-hook and requires audio service. The balance of the receiver is kept energized at all times to permit detection of received supervisory signals as discussed in connection with FIG. 3.

Figure 6:
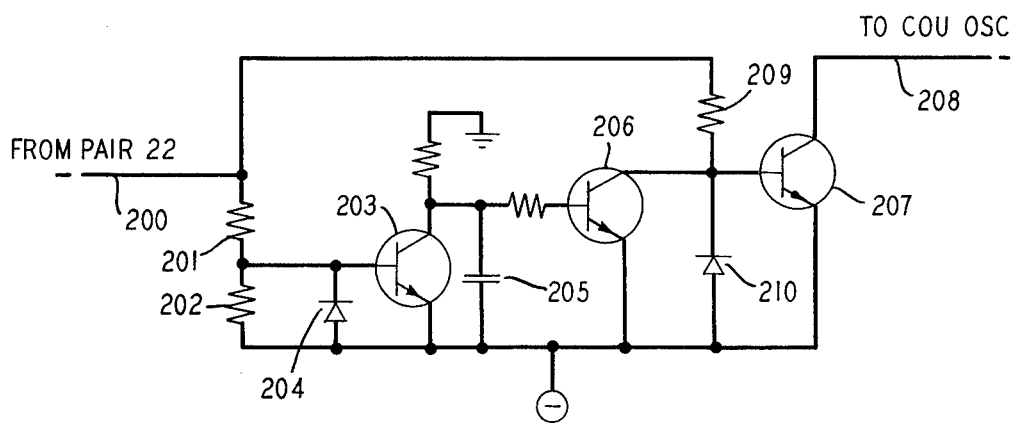
FIG. 6 is a detailed circuit diagram of the ringing control circuits shown in the central office unit of FIG. 2.

In FIG. 6 there is shown a detailed circuit diagram of the ringing control circuits 37 of FIG. 1. A ringing control signal appears on lead 200 from the voltage divider comprising resistors 38 and 39 in FIG. 2. This signal is supplied through resistor 209 to operate transistor 207 and enable the transmitter oscillator via lead 208. This signal is also applied across resistors 201 and 202, the midpoint of which is connected to the base of transistor 203. A diode rectifier 204 is connected across resistor 202 to protect transistor 203 from large inverse voltages on the office appearance.

When sufficient current is drawn through resistors 201 and 202 to turn transistor 203 OFF, the capacitor 205 slowly charges to turn transistor 206 OFF. In going OFF, transistor 206 allows transistor 207 to be turned ON, as described above, and deliver a control signal by way of lead 208 to key the transmitter oscillator 43 in FIG. 2 ON. Transistors 203 and 206, together with capacitor 205, thereby prevent operation of transistor 207 in response to transient conditions on the subscriber appearance. Once capacitor 205 is charged, it remains charged throughout the ringing cycle and transistor 207 is free to follow the ringing signal.

Diode 210 protects transistor 207 from damage caused by large inverse voltage surges in the central office appearance 22 in FIG. 2. Such voltages might be used, for example, in leakage tests of the physical subscriber's line.

Figure 7:
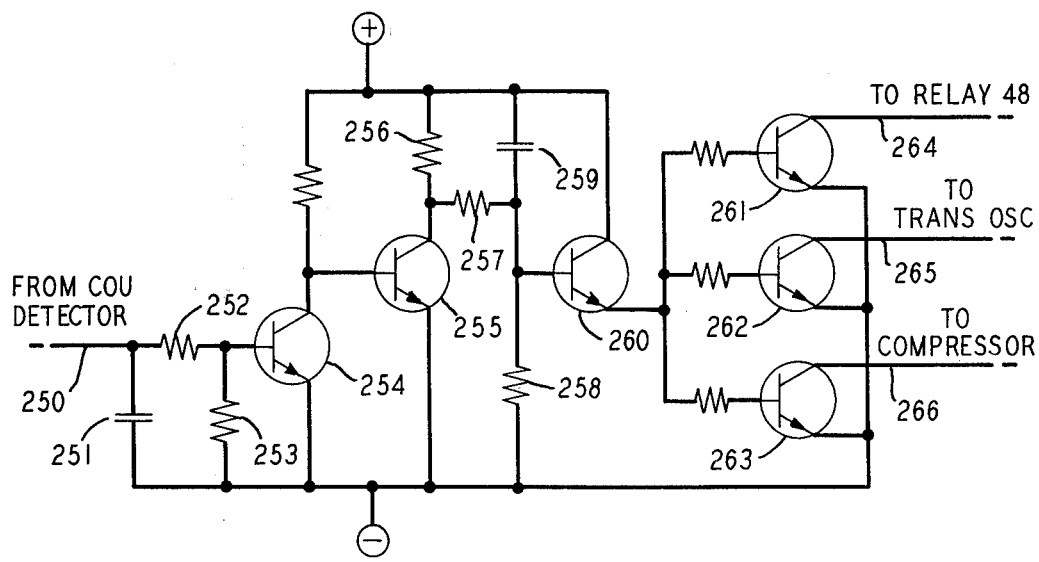
FIG. 7 is a detailed circuit diagram of the signal control circuits of the central office unit shown in FIG. 2.

In FIG. 7 there is shown a detailed circuit diagram of the signal control circuits 41 in FIG. 2. The circuits of FIG. 7 are operated by the detected audio signals on lead 250 from detector 56 in FIG. 2. The carrier signals are filtered out by capacitor 251 and the audio portion supplied by way of a voltage divider comprising resistors 252 and 253 to the base of transistor 254. When going ON, transistor 254, in turn, turns transistor 255 ON. Capacitor 259 filters the audio voltage and, after a sufficient delay to insure immunity from noise, turns transistor 260 ON. Transistor 260, when operated, turns ON transistors 261, 262, and 263.

Transistor 261 provides a control signal on lead 264 to operate relay 48 on FIG. 2. Transistor 262 provides a control signal on control 265 to the oscillator 43 of FIG. 2. The signal is used to supply operating voltage to the transmitter oscillator (FIG. 4) and thus initiate oscillations for transmission to the subscriber unit. Transistor 263 provides a control signal on the 266 which enables the compressor 47 of FIG. 2 and thereby permits the processing of voice signals in the compressor.

It can be seen that the transmitter and receiver circuits of FIG. 4 and 5, respectively, can be used at both the central office and subscriber units and that both can be integrated on single integrated circuit chips. Both receivers include clamped AGC circuits and both the transmitter and receiver circuit include diode bridge vario-lossers. Finally, the transmitters both include amplitude-stabilized oscillators with constant current sources in the energizing path to the oscillator.

Although the principles of the present invention have been explained in connection with particular circuits, it is readily apparent that these principles can be realized in numerous other circuits which are physically dissimilar from the disclosed circuits and yet operate on the same principles. The various amplifiers which have been shown in symbolic form can take the form of well-known amplifier arrangements and indeed can be purchased individually as integrated circuit devices.

What is claimed is:

1. A carrier receiving circuit including a variable attenuation circuit, a detector, and an automatic gain control circuit connecting the output of said detector to said attenuation circuit in order to maintain the average output of said detector at a preselected level, characterized by
    a direct current clamp circuit connected to said automatic gain control circuit to clamp the output from said gain control circuit at a value close to the middle of the normal operation range of said automatic gain control circuit,
    a differential amplifier for comparing the output of said detector to a preselected value, and
    means responsive to said differential amplifier circuit for enabling said clamp circuit.

2. An automatic gain control circuit comprising
    a source of input signals,
    a variable attenuation circuit,
    means for detecting the average signal level of the output of said attenuation circuit,
    a control circuit for controlling said attenuation circuit in response to said average signal level, and
    a direct current clamp circuit responsive to the absence of signals from said source for clamping the output from said control circuit at a level close to the midrange value of said direct current.

3. The automatic gain control circuit according to claim 2 wherein said variable attenuation circuit comprises a diode bridge circuit connected in parallel with said source.

4. The automatic gain control circuit according to claim 2 wherein said clamp circuit comprises
    a differential amplifier,
    a fixed voltage source connected to one input to said differential amplifier,
    means for connecting said control circuit to the other input of said differential amplifier, and
    switching means operated by the output of said differential amplifier to connect the input of said control circuit to a preselected voltage.

5. An analog modulated signal receiver comprising
    a source of modulated signals,
    a detector for said modulated signals,
    a variable attenuation circuit connected between said source and said detector,
    an automatic gain control circuit connected to the output of said detector and providing a control voltage to said variable attenuation circuit, and
    a direct current clamp circuit connected to said automatic gain control circuit to clamp the output of said automatic gain control circuit to a fixed level in the absence of output signals from said detector.

6. The receiver according to claim 5 wherein said variable attenuation circuit comprises a balanced diode bridge.

7. The receiver according to claim 5 wherein said clamp circuit comprises
    a differential amplifier for determining the difference between said input to said automatic gain control circuit and a reference signal, and
    a switch connecting said input to a reference level in response to said differential amplifier.

8. An automatic gain control circuit comprising
    a source of gain control signals, and
    a clamp circuit responsive to the absence of signals from said source to clamp the output of said gain control circuit to a preselected value.

* * * * *